US006477024B1

(12) United States Patent
Kikuchi et al.

(10) Patent No.: US 6,477,024 B1
(45) Date of Patent: Nov. 5, 2002

(54) FAULT DETERMINATION APPARATUS AND FAULT DETERMINATION METHOD FOR A BATTERY SET

(75) Inventors: Yoshiaki Kikuchi, Toyota; Shigehiro Kawauchi, Aichi, both of (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 09/520,445

(22) Filed: Mar. 7, 2000

(30) Foreign Application Priority Data

Mar. 12, 1999 (JP) .......................................... 11-066222

(51) Int. Cl.[7] ................................................ H02H 3/18
(52) U.S. Cl. ........................ 361/79; 324/430; 324/432; 324/434
(58) Field of Search .............................. 361/90, 79, 56, 361/57, 65; 320/116; 324/426, 429, 432, 430, 434

(56) References Cited

U.S. PATENT DOCUMENTS

| 4,433,294 A | * | 2/1984 | Windebank ................... 324/426 |
| 4,692,682 A | | 9/1987 | Lane et al. .................... 320/35 |
| 5,170,124 A | | 12/1992 | Blair et al. .................... 324/434 |
| 5,581,170 A | | 12/1996 | Mammano et al. ............ 320/17 |
| 5,773,956 A | | 6/1998 | Wieczorek .................... 320/30 |
| 6,002,238 A | * | 12/1999 | Champlin ..................... 320/134 |
| 6,044,331 A | * | 3/2000 | Saigo ............................. 702/63 |
| 6,163,135 A | | 12/2000 | Nakayama et al. .......... 320/150 |
| 6,222,345 B1 | * | 4/2001 | Yamanashi ................... 320/132 |
| 6,313,637 B1 | * | 11/2001 | Iino et al. ..................... 324/434 |

FOREIGN PATENT DOCUMENTS

| FR | 2 611 314 A3 | 9/1988 | .......... H01M/10/48 |
| WO | WO 98/48290 | 10/1998 | ........... G01R/31/36 |

OTHER PUBLICATIONS

Konya et al., A Deterioration Estimating System for 200–Ah Sealed Lead–acid Batteries, Proceedings of the International Telecommunications Conference (INTELC), vol. CONF. 16, pp. 256–262, XP000623339, 1994, No Month.
F. Asakawa et al., Battery Deterioration Detection Device, JIII (Japan Institute of Invention and Innovation); Journal of Technical Disclosure, Journal Number: 98–3030, May, 2000.

* cited by examiner

Primary Examiner—Ronald W. Leja
(74) Attorney, Agent, or Firm—Oliff & Berridge, PLC (57) ABSTRACT

By finding a voltage difference $\Delta V$ between the maximum value and the minimum value of voltage of each cell constituting a battery set and then combining the voltage difference $\Delta V$ with current I passing through the battery set into a value pair and store a plurality of the value pairs, the relationship between the voltage difference $\Delta V$ and the current I is a relation represented by a straight line with the slope $\Delta R$ thereof corresponding to an internal-resistance difference. Therefore, fault in the battery set can be determined from the magnitude of the slope $\Delta R$ computed by a least-squares method. Fault determination for a battery set is made more accurate because variations in electromotive force caused by charge-and-discharge patterns and by changes in temperature are canceled when the voltage difference $\Delta V$ is determined.

22 Claims, 3 Drawing Sheets

FAULT DETERMINATION APPARATUS AND FAULT DETERMINATION METHOD FOR A BATTERY SET

BACKGROUND OF THE INVENTION

1. Field of the Invention

The present invention relates to a fault determination apparatus and fault determination method for a battery set and more particularly to a fault determination apparatus and fault determination method for a battery set formed by a plurality of serially connected cells.

2. Description of the Related Art

One fault determination apparatus proposed for this type of battery set determines fault on the basis of the magnitude of internal-resistance calculated on each cell, or on each block including a plurality of cells. Because the internal resistance of a cell depends on its construction, the fault of the cell can be determined by calculating the internal resistance and using the resulting value as determination criteria.

However, such apparatuses which determine fault by calculating the internal resistance and using the resulting value as criteria suffer in that certain charge-and-discharge patterns lead to difficulties in accurate determination. Electromotive force of the battery set varies according to the charge-and-discharge patterns. Even though the internal resistance can be accurately calculated when the electromotive force of the battery does not vary, the internal resistance can assume a normal or an abnormal value depending on the charge-and-discharge pattern. The fact that the electromotive force of the battery also varies as the temperature of the battery changes exacerbates the problem outlined above. In addition, calculating the internal resistance for each of the cells or each block requires such an enormous amount of computing processes that a high-performance computer must be used for the computation.

SUMMARY OF THE INVENTION

It is an object of the present invention to provide a fault determination apparatus and fault determination method for a battery set, which do not suffer from the above problems and which can accurately determine fault of a battery set regardless of variations in the charge-and-discharge patterns or in temperature; it is a further object of the present invention to provide a fault determination apparatus and fault determination method for a battery set capable of executing said fault determination with simple computation.

To achieve the above objects to a varying degree, the fault determination apparatus and fault determination method for a battery set of the present invention can be configured as described below.

The fault determination apparatus for a battery set of the present invention for determining fault of a battery set comprising a plurality of serially connected cells, comprises a voltmeter for measuring the voltage of each of the plurality of cells, an ammeter for measuring electric current passing through said battery set, and a fault determination means for receiving input values of said voltage measured by said voltmeter at predetermined timing, computing a voltage difference between the maximum value and the minimum value of said voltage, inputting the value of electric current measured by said ammeter at the same timing with said predetermined timing, storing a plurality of value pairs containing said electric current and said computed voltage difference, and determining fault of said battery set on the basis of the stored value pair.

The principle of fault determination of a battery set through use of a plurality of value pairs containing difference between the maximum and the minimum voltage values and the current passing through a battery set is described below. Voltage (V) of a battery can be represented by subtracting the product of current (I) passing through the battery and the internal resistance (R) from the electromotive force (V0) as shown in the following equation (1).

$$V = V0 - R \cdot I \tag{1}$$

In a battery set in which normal and abnormal cells are connected in series to each other, voltages of both normal and abnormal cells can be represented by the above equation (1) and the following equations (2) and (3) can be obtained. In these equations, both currents (I) passing through the cells are equal because the battery set is formed by normal cells and abnormal cells connected in series.

$$V1 = V01 - R1 \cdot I \tag{2}$$

$$V2 = V02 - R2 \cdot I \tag{3}$$

By subtracting equation (2) from equation (3), the following equation (4) can be obtained, wherein the left side of the equation represents the voltage difference ($\Delta V$).

$$\Delta V = V2 - V1 = (V02 - V01) - (R2 - R1) \cdot I \tag{4}$$

When the voltage of each of the cells and the current of the battery set can be measured, the voltage difference ($\Delta V$) and the current (I) can be treated as known values, and therefore, only the values of the electromotive-force difference and the internal-resistance difference are remain unknown. The electromotive-force difference and the internal-resistance difference can be calculated from two or more value pairs containing voltage difference and current. Because battery fault usually manifests itself in the internal-resistance difference, fault can be determined from the internal-resistance difference. In other words, when one of the cells is normal, the normality of the other cell can be determined on the basis of a plurality of the value pairs, by finding a value corresponding to the internal-resistance difference from the plurality of the value pairs.

Cell fault is determined by assuming the other cell to be normal in the principle described above. In the fault determination apparatus for a battery set of the present invention, fault of a battery set is determined by first computing the voltage difference between the maximum and the minimum voltage values of each of the cells, assuming that the cell with the maximum voltage value is normal and that the cell with the minimum voltage value can be a cell with a fault, and determining fault of the battery set by examining the cell having the minimum voltage value.

The fault determination apparatus for a battery set of the present invention allows determination of battery set fault on the basis of the voltage difference between the maximum and minimum voltage values of each of the cells in conjunction with the current passing through the battery set. Moreover, because variations in electromotive force are canceled by computing a difference, the fault determination is not affected by the charge-and-discharge patterns and temperature fluctuations.

In accordance with one aspect of the fault determination apparatus for a battery set of the present invention, the fault determination means mentioned above can determine the fault when a predetermined number of said value pairs are stored or when said stored current values contained in the plurality of the value pairs are distributed beyond a predetermined range. The fault determination of a battery set becomes more accurate by determining the fault using the predetermined number of value pairs or the distribution beyond the predetermined range as described above.

In addition, in accordance with another aspect of the fault determination apparatus for a battery set of the present invention, said fault determination means can also determine fault by computing the slope using the least-squares method from said plurality of the value pairs, and using said slope for fault determination. The aforementioned equation (4) represents a straight line with the slope being the internal-resistance difference. By calculating the slope with the least-squares method as a linear approximation, fault of the battery set can be determined. In such a fault determination apparatus for a battery set which performs fault determination using slope described above, said fault determination means can also determine that fault is encountered when an absolute value of said slope is larger than a predetermined value.

A fault determination method for a battery set of the present invention for determining fault of a battery set comprising a plurality of serially connected cells, comprises the steps of measuring voltage of each of the plurality of cells at a predetermined timing, computing a voltage difference between the maximum value and the minimum value of the measured voltage, measuring electric current passing through the battery set at the same timing with said predetermined timing, storing a plurality of value pairs containing the measured electric current and said computed voltage difference, and determining fault of said battery set on the basis of the stored value pairs.

In accordance with one aspect of the fault determination method for a battery set of the present invention, a fault can be determined when a predetermined number of said value pairs are stored or when said stored current values contained in the plurality of the value pairs are distributed beyond a predetermined range. In addition, fault can be determined by computing the slope by least-squares method using said plurality of the value pairs values and deciding that fault is encountered when an absolute value of said slope is larger than a predetermined value.

DESCRIPTION OF THE PREFERRED EMBODIMENTS

Figure 1:
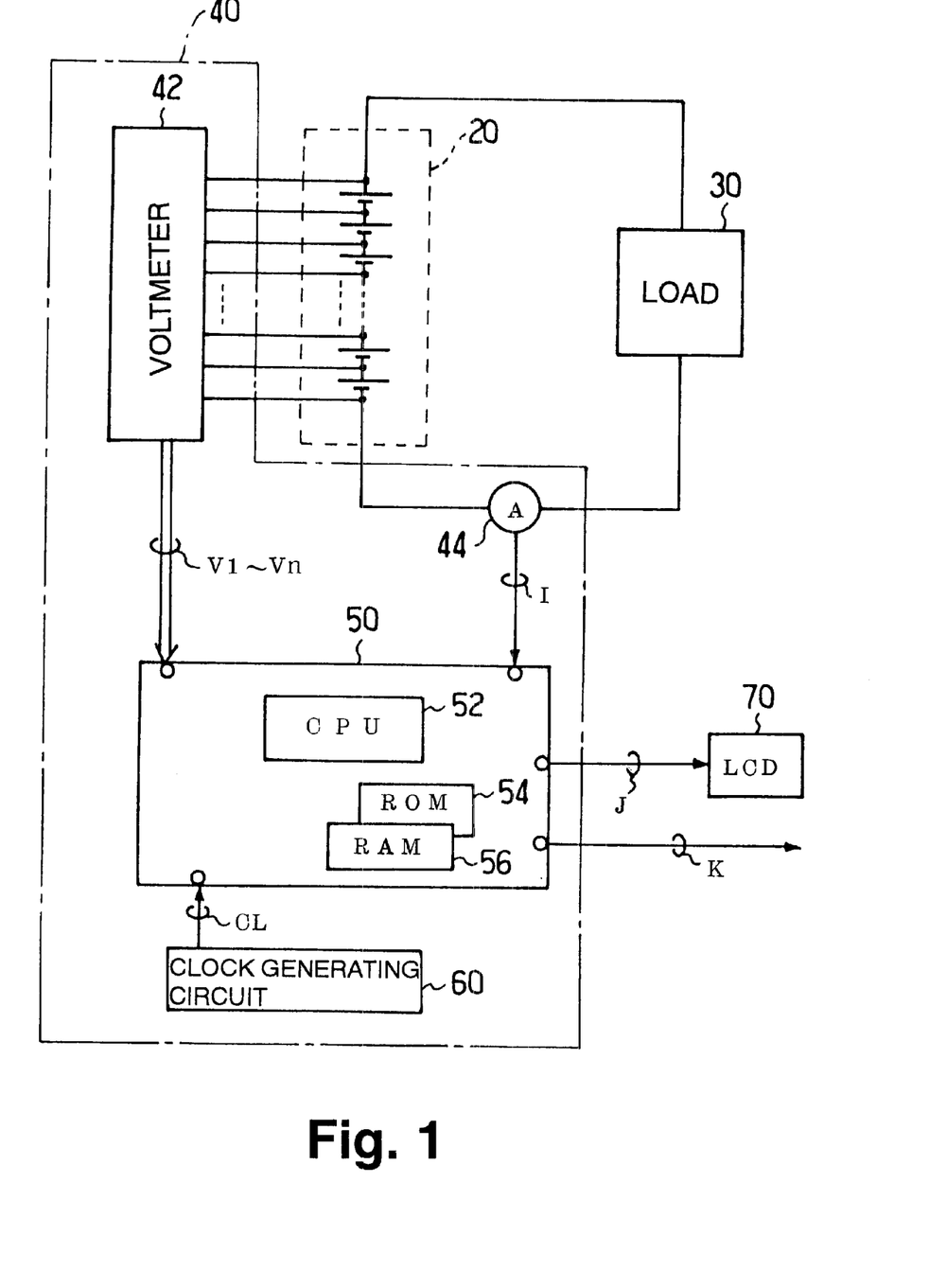
FIG. 1 is a diagram illustrating a schematic construction of a fault determination apparatus 40 for a battery set in accordance with one embodiment of the present invention.

A first preferred embodiment of this invention will be described with reference to the attached drawings in which FIG. 1 is a diagram illustrating a schematic construction of a fault determination apparatus 40 for a battery set in accordance with this first embodiment of the invention. The fault determination apparatus 40 for a battery set is attached to a battery set 20 in which n cells are serially connected as shown in the figure. The battery set 20 is connected to a load 30 which operates by charging and discharging the battery set 20.

The fault determination apparatus 40 of this embodiment comprises a voltmeter 42 including a plurality of voltmeters for measuring voltage V1 to Vn of each of the cells of the battery set 20, an ammeter 44 for measuring current I passing through the battery set 20, an electronic processing device 50 which globally controls the fault determination apparatus 40 and executes fault determination process for the battery set 20, a clock generating circuit 60 for outputting a clock signal CL to the electronic processing device 50 at predetermined intervals (for example, every 10 ms), and a power supply circuit (not illustrated) for supplying necessary power to each portion of the fault determination apparatus 40.

The electronic processing device 50, which is a one-chip microcomputer with CPU 52 as the main component, includes an internal ROM 54 in which processing programs are prestored, an internal RAM 56 for temporarily storing data, and various kinds of input and output ports in its interior. The input ports receives the voltage V1 to Vn of each of the cells in the battery set 20 measured by the voltmeter 42, the current I measured by the ammeter 44 and the clock signal CL output from the clock generating circuit 60 etc. The output ports output fault determination signals J and K for sending a fault determination result of the battery set 20 from the fault determination apparatus 40 to an LCD 70 and other devices (for example, a computer for controlling operation of the battery set 20 or a computer for controlling operation of the load 30, neither of which are shown).

Figure 2:
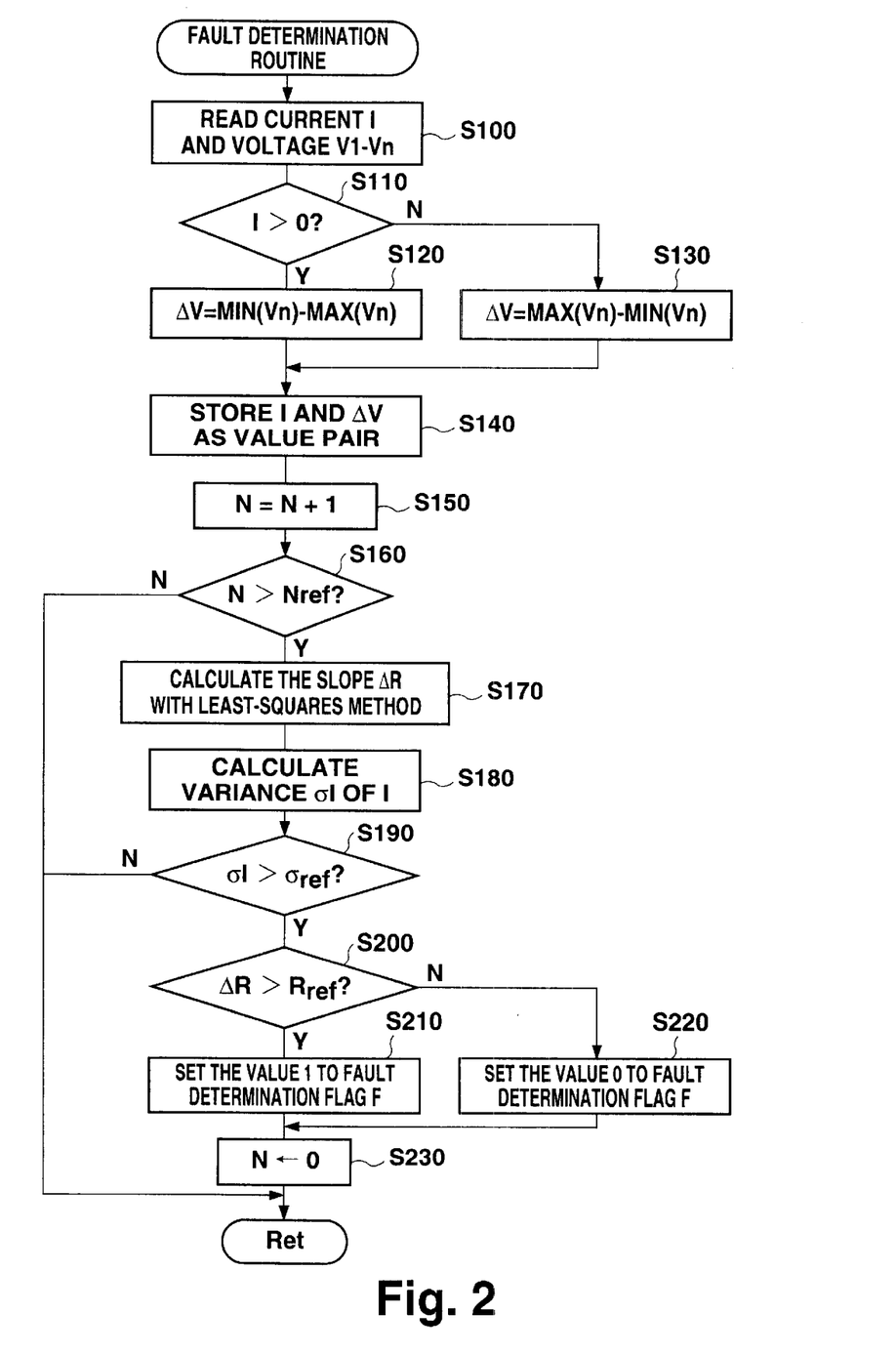
FIG. 2 is a flow chart of one of the fault determination routines which is executed by an electronic processing device 50 in the fault determination apparatus 40 of one embodiment of the present invention.

The fault determination apparatus 40 is configured such that the fault determination routine prestored in the internal ROM 54 is iterated at a predetermined interval (for example, every 10 ms) in order to monitor whether or not fault of the battery set 20 is encountered. An example of the fault determination routine is illustrated in FIG. 2. The timing of executing the fault determination routine shown in FIG. 2 is decided by counting the clock signal CL sent from the clock generating circuit 60. The fault determining procedure for the battery set 20 using the fault determination apparatus 40 is described below referring the fault determination routine.

When the fault determination routine is started, the CPU 52 first executes a process of reading the current I measured by the ammeter 44 and the voltage V1 to Vn of each of the cells in the battery set 20 measured by the voltmeter 42 at a concurrent timing (Step S100). Then the CPU 52 determines whether the. read value of the current I is greater than the value 0 (Step 110). The CPU 52 then computes the voltage difference $\Delta V$ by subtracting the maximum value from the minimum value of the read values among voltage V1 to Vn when the read value of current I is greater than the value 0 (Step S120), or subtracting the minimum value from the maximum value of the read values among voltage V1 to Vn when the read value of the current I is smaller than or equal to the value 0 (Step S130). There are two conditions for the current I, one having a value greater than the value 0 (i.e. a discharge state of the battery set 20, where the power is consumed through the load 30) and the other having a the value smaller than or equal to the value 0 (i.e. a charge state of the battery set 20). Therefore, the sign of the voltage difference $\Delta V$ must be changed according to the value of the current I in the above-mentioned procedure in order to handle the voltage difference $\Delta V$ equally in both conditions.

After these steps, the CPU 52 temporarily stores the computed voltage difference $\Delta V$ and the current I as a value pair in the internal RAM 56 (Step S140), increments a counter N (Step S150) and then determines whether the value of the counter N is greater than a threshold value Nref (Step S160). The counter N counts the number of the value pairs containing the voltage difference ΔV and the current I stored in the internal RAM 56 and is initialized to a value of 0 by an initialization routine (not illustrated) upon the start-up of the fault determination apparatus 40. The Nref is set to number of value pairs sufficient for determining fault of the battery set 20 according to the required degree of stability for the battery set 20, the number of cells constituting the battery set 20, or the variability in the cell products etc. When the value of the counter N is smaller than or equal to the threshold Nref, it is concluded that the stored number of the value pairs is not sufficient to determine fault of the battery set 20 and the routine is terminated.

When the value of the counter N is greater than the threshold Nref, the slope ΔR is computed with least-squares method using the N stored value pairs (Step S170), while a variance σI is computed from the N values of the current I (Step S180). Because the computing procedures for calculating ΔR through the least-squares method and the variance of σI of the current I use a common computational algorithm, they are not described here.

Following these, it is determined whether variance σI of the current I is greater than a threshold σref (Step S190). The variance σI of the current I is considered here because accuracy of computing the slope ΔR with the least-squares method depends on the variance σI of the current I even when it is concluded that the stored number of the value pairs is enough for determining fault of the battery set 20 from comparison of the value of the counter N with the threshold Nref. When the variance σI of the currents I is smaller than or equal to the threshold σref, it is concluded that the slope ΔR is not accurate enough to perform fault determination of the battery set 20 with a sufficient degree of precision and this routine is terminated.

Figure 3:
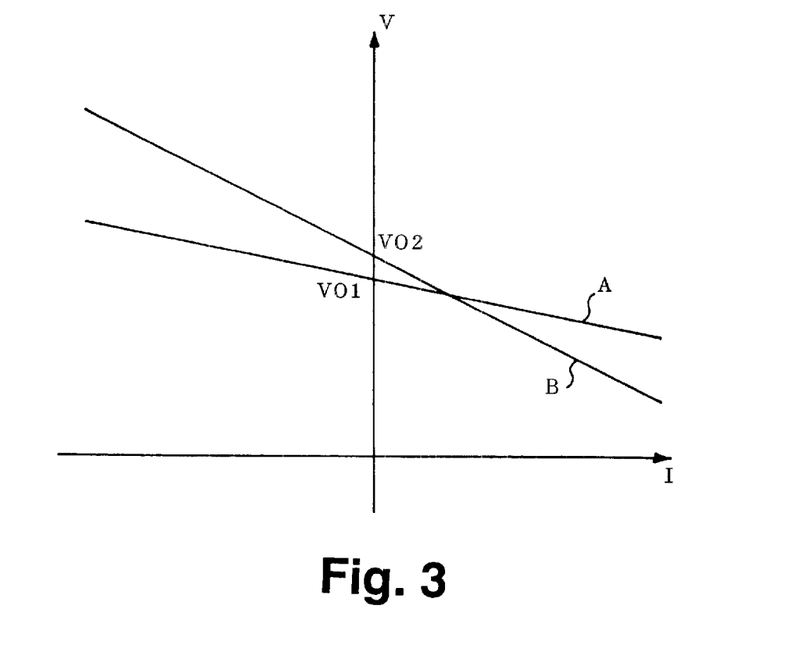
FIG. 3 is a graph representation illustrating each one of the relations between voltage and current for a normal and an abnormal cells.
Figure 4:
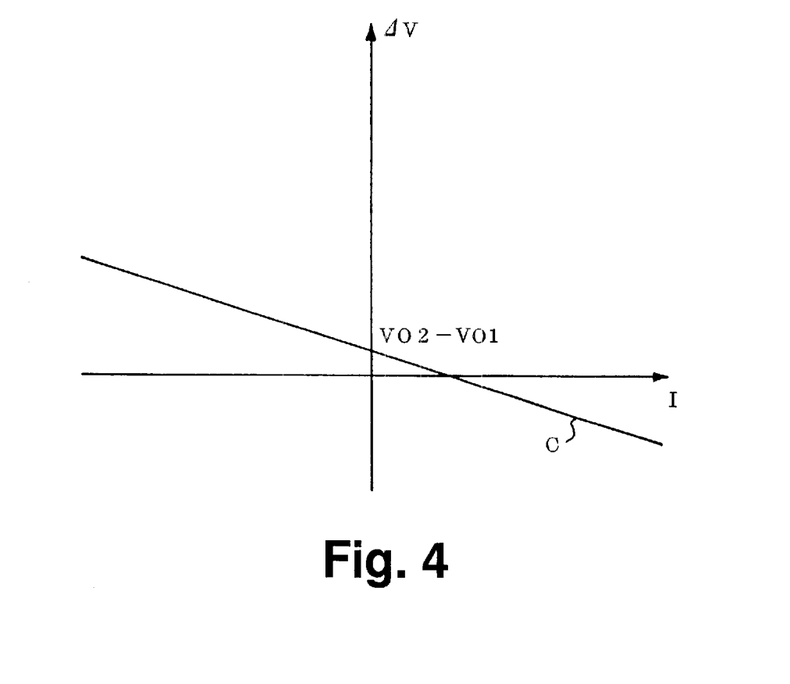
FIG. 4 is a graph representation showing one of the relations between voltage difference $\Delta V$ and current I when fault is encountered.

However, when the variance σI of the current I is greater than the threshold σref, the slope ΔR is compared with a threshold Rref (Step S200). The fault of a battery manifests itself in the internal-resistance difference as mentioned above in the description of the principle of the present invention. Fault of the battery set 20 of the present embodiment can, therefore, be determined from the internal-resistance difference, that is, the slope ΔR. In this embodiment, the internal-resistance difference is obtained as the slope ΔR with by assuming that the relationship between the voltage difference ΔV and the current I is represented by a straight line because the relationship between voltage and current of each of a normal cell and an abnormal cell can be represented by straight lines. FIG. 3 shows two relations between voltage and current, one for a normal cell and the other for an abnormal cell. A straight line A represents the relation between voltage and current for a normal cell and a straight line B represents the relation between voltage and current for an abnormal cell. These respective relations are represented in the figure using a straight line as derived from the equations (2) and (3) mentioned above. As a result, the relation between the voltage difference ΔV and the current I is also represented by a straight line as shown in FIG. 4. When all the cells constituting the battery set 20 are normal, their characteristic line is similar to the line A in FIG. 3. Therefore the value of the slope ΔR is close to the value 0. When any one of the cells constituting the battery set 20 are abnormal, the abnormal cell has characteristics represented by an inclined line distinct from the line A similar to the case of the line B in FIG. 3 except that the electromotive force V02 is different. The slope ΔR is, therefore, considerably greater than the value 0. For this reason, comparing the slope ΔR with the threshold Rref allows determination of fault of the battery set 20. Here, the threshold Rref is set according to the characteristics of the cells constituting the battery set 20, and the variability of cell products etc.

When it is concluded that the slope ΔR is greater than the threshold Rref after comparing the slope ΔR with the threshold Rref, an abnormal condition is encountered in at least some of the cells constituting the battery set 20. A value 1 is set to a fault determination flag F because the occurrence of the fault of the battery set 20 is determined (Step S210) and the counter N is reset to a value 0 (Step S230). The routine is terminated at this point. On the other hand, when the slope ΔR is less than or equal to the threshold Rref, all cells constituting the battery set 20 are determined to be a normal condition. As a result, a value 0 is set to the fault determination flag F (Step 220) and the counter N is reset to a value 0 (Step S230). The routine is terminated at this point. The value of the fault determination flag F, set in such a manner mentioned above, is output to the LCD 70 and other devices as fault determination signals J and K in the fault determination apparatus 40 of the present embodiment.

The fault determination apparatus 40 of this embodiment described above is capable of determining fault of the battery set 20 on the basis of the value pairs containing the current I passing through the battery set 20 and the voltage difference ΔV between the maximum and the minimum values among voltages V1 to Vn of each of the cells constituting the battery set 20. Moreover, because various types of charge-and-discharge patterns are included by considering variance σI of the current I, enables accurate fault determination of the battery set 20 can be performed regardless of the charge-and-discharge patterns. Although the cell characteristics for both normal and abnormal cells change depending on variations in temperature of the battery set 20, the voltage difference ΔV between the voltage values compensates for characteristic variations. This also enables accurate fault determination of the battery set 20 regardless of the occurrence of a change in temperature in the battery set 20. Furthermore, the fault of the battery set 20 is determined by computing only the slope ΔR through least-squares method. This procedure is much simpler than the procedure of computing all the internal resistance values of each of the cells constituting the battery set 20 or of each battery block comprising a plurality of cells.

In the fault determination apparatus 40 for a battery set of this embodiment, the fault of the battery set 20 is decided when the number of the value pairs containing of the voltage difference ΔV and the current I is greater than the threshold Nref and when the variance σI of the current I is greater than the σref. It is also acceptable to execute the fault determination of the battery set 20 when the number of the value pairs containing the voltage difference ΔV and the current I is greater than the threshold Nref without considering the variance σI of the current I or executed when the variance σI of the current I is greater than σref without using the counter N.

The relationship between voltage and current is conceived as a relation represented by straight line irrespective of whether the cell is normal, and the fault of the battery set is determined through finding the slope ΔR of the internal-resistance difference with a linear-approximation procedure using the least-squares method in the fault determination apparatus 40 for a battery set of this embodiment. However, the fault can also be determined by conceiving the relationship between voltage and current as other than linear, such as a cubic function or Besier curve, and consequently, the relationship between the voltage difference ΔV and current I as a relation other than a strait line, and determining the fault by considering a term which depends on the internal resistance of the cell.

While a preferred form of this invention has been described using particular embodiments it is to be distinctly understood that the invention is not limited thereto and variations are possible within the scope of this invention.

What is claimed is:

1. A fault determination apparatus for a battery set for determining fault of a battery set comprising a plurality of serially connected cells, the apparatus comprising:
    a voltmeter for measuring the voltage of each of the plurality of serially connected cells;
    an ammeter for measuring electric current passing through said battery set; and
    a fault determination means for receiving input voltage values measured by said voltmeter at a predetermined timing, computing a voltage difference between the maximum and the minimum values of said voltage, inputting the value of electric current measured by said ammeter at the same timing with said predetermined timing, storing a plurality of value pairs containing said electric current and said computed voltage difference, and determining fault of said battery set on the basis of the stored value pairs.

2. A fault determination apparatus for a battery set according to claim 1, wherein said fault determination means performs fault determination when it has recognized that a predetermined number of said plurality of said value pairs are stored.

3. A fault determination apparatus for a battery set according to claim 2, wherein said fault determination means determines fault by computing the slope by least-squares method using said plurality of the value pairs and using the resulting value.

4. A fault determination apparatus for a battery set according to claim 3, wherein said fault determination means determines the fault encounter when an absolute value of said slope is larger than a predetermined value.

5. A fault determination apparatus for a battery set according to claim 1, wherein said fault determination means performs fault determination when said current values contained in the plurality of the value pairs stored by storing means are distributed beyond a predetermined range.

6. A fault determination apparatus for a battery set according to claim 5, wherein said fault determination means determines on the basis of the slope computed by least-squares method using said plurality of the value pairs.

7. A fault determination apparatus for a battery set according to claim 6, wherein said fault determination means determines fault encounter when an absolute value of said slope is larger than a predetermined value.

8. A fault determination method for a battery set for determining fault of a battery set comprising a plurality of serially connected cells, the method comprising the steps of;
    measuring voltage of each of the plurality of cells at a predetermined timing,
    computing a voltage difference between the maximum and the minimum values of the measured voltage,
    measuring electric current passing through the battery set at the same timing as said predetermined timing,
    storing a plurality of value pairs containing the measured electric current and said computed voltage difference, and determining fault of said battery set on the basis of the stored value pairs.

9. A fault determination method for a battery set according to claim 8, wherein fault is decided when a predetermined number of said plurality of said value pairs are stored.

10. A fault determination method for a battery set according to claim 9, wherein fault is determined on the basis of the slope computed by least-squares method using said plurality of the value pairs.

11. A fault determination method for a battery set according to claim 10, wherein it is determined that fault is encountered when an absolute value of said slope is larger than a predetermined value.

12. A fault determination method for a battery set according to claim 8, wherein fault is decided when said current values contained in the plurality of the value pairs stored by storing means are distributed beyond a predetermined range.

13. A fault determination method for a battery set according to claim 12, wherein fault is determined on the basis of the slope computed by least-squares method using said plurality of the value pairs.

14. A fault determination method for a battery set according to claim 13, wherein it is determined that fault is encountered when an absolute value of said slope is larger than a predetermined value.

15. A fault determination apparatus for a battery set for determining fault of a battery set comprising a plurality of serially connected cells, the apparatus comprising:
    a voltmeter that measures a voltage value of each of the plurality of serially connected cells;
    an ammeter that measures electric current passing through the battery set;
    an electronic processing device that controls the fault determination apparatus and executes a fault determination process;
    a clock generating circuit that outputs a clock signal to the electronic processing device at a predetermined timing; and
    a power supply that supplies power to each portion of the fault determination apparatus, wherein the electronic processing device receives input voltage values measured by the voltmeter at the predetermined timing, computes a voltage difference between the maximum and the minimum values of the voltage, receives the value of electric current measured by the ammeter at the predetermined timing, stores a plurality of value pairs containing the electric current and the computed voltage difference, determines fault of the battery set on the basis of the stored pairs and outputs fault determination signals to at least a display.

16. A fault determination apparatus for a battery set for determining fault of a battery set comprising a plurality of serially connected cells, the apparatus comprising:
    a voltmeter that measures a voltage of each of the plurality of serially connected cells;
    an ammeter that measures electric current passing through the battery set;
    an electronic processing device that controls the fault determination apparatus and executes a fault determination process; and
    a power supply that supplies power to each portion of the fault determination apparatus, wherein the fault determination process includes, receiving the input voltage values measured by the voltmeter at a predetermined timing interval, computing a voltage difference between the maximum and the minimum voltage values, receiving the value of the electric current measured by the ammeter at the predetermined timing, storing a plurality of value pairs containing the electric current and the computed voltage difference, determining fault of the battery set on the basis of the stored pairs and outputting fault determination signals to at least a display.

17. A fault determination apparatus for a battery set for determining fault of a battery set comprising a plurality of serially connected cells, the apparatus comprising:

a voltmeter that measures a voltage value of each of the plurality of serially connected cells;

an ammeter that measures electric current passing through the battery set;

a power supply that supplies power to each portion of the fault determination apparatus, and a fault determinator that receives voltage values measured by the voltmeter at a predetermined timing, computes a voltage difference between the maximum and minimum values of the voltage, receives the value of electric current measured by the ammeter at the predetermined timing, stores a plurality of value pairs containing the electric current and the computed voltage difference and determines fault of the battery set on the basis of the stored pairs.

18. A fault determination apparatus for a battery set according to claim 17, further comprising a clock generating circuit that outputs a clock signal to the fault determinator at the predetermined timing.

19. A fault determination apparatus for a battery set according to claim 18, wherein the fault determinator outputs fault determination signals externally of the fault determination apparatus.

20. An electronic processing apparatus for determining a fault of a battery set comprising a plurality of serially connected cells, wherein the electronic processing apparatus receives voltage values of each of the plurality of serially connected cells at the predetermined timing, computes a voltage difference between the maximum and minimum values of the voltage, receives the value of electric current passing through the battery set at a predetermined timing, stores a plurality of value pairs containing electric current and the computed voltage difference and determines fault of the battery set on the basis of the stored pairs.

21. An electronic processing apparatus for a battery set according to claim 20, the electronic processing apparatus further receives a clock signal at the predetermined timing.

22. An electronic processing apparatus for a battery set according to claim 21, wherein the electronic processing apparatus outputs fault determination signals externally of the electronic processing apparatus.

* * * * *

UNITED STATES PATENT AND TRADEMARK OFFICE
CERTIFICATE OF CORRECTION

PATENT NO. : 6,477,024 B1
DATED : November 5, 2002
INVENTOR(S) : Yoshiaki Kikuchi and Shigehiro Kawauchi It is certified that error appears in the above-identified patent and that said Letters Patent is hereby corrected as shown below:

Column 7,
Line 14, replace the first occurrence of "the" with -- a --.
Lines 16 and 62, after "measuring", add -- an --.
Line 18, delete "a".
Lines 26 and 39, replace "the" with -- a --.
Lines 28-51, replace "A" with -- The --.
Line 34, replace "the: with -- a --;
Line 35, replace the second occurrence of "the" with -- a --.
Line 57, replace ";" with -- : --.
Line 58, after "measuring", add -- a --.

Column 8,
Lines 1-20, replace "A" with -- The --.
Lines 2, 5, 13 and 17, after "wherein", add -- the --.
Line 5, replace the second occurrence of "the" with -- a --.
Line 9, after "that", add -- the --.
Line 13, remove the term "said".
Line 18, replace "the" with -- a --.
Line 21, after "that", add -- the --.
Lines 29 and 54, after "measures", add -- an --.
Line 61, replace "the" with -- an --.

Column 9,
Line 11, after "measures", add -- an --.
Line 19, before the term "electric", add -- the --.
Line 24, replace "A" with -- The --.

Column 10,
Line 3, replace "A" with -- The --.
Line 13, before the term "electric", add -- an --.
Line 15, before the term "electric", add -- the --.

UNITED STATES PATENT AND TRADEMARK OFFICE
CERTIFICATE OF CORRECTION

PATENT NO. : 6,477,024 B1
DATED : November 5, 2002
INVENTOR(S) : Yoshiaki Kikuchi and Shigehiro Kawauchi It is certified that error appears in the above-identified patent and that said Letters Patent is hereby corrected as shown below:

<u>Column 10 (cont'd),</u>
Lines 18-21, replace "An" with -- The --.

Signed and Sealed this

Tenth Day of February, 2004

JON W. DUDAS
*Acting Director of the United States Patent and Trademark Office*